(12) United States Patent
Aggarwal et al.

(10) Patent No.: US 7,149,993 B1
(45) Date of Patent: Dec. 12, 2006

(54) METHOD, SYSTEM, AND APPARATUS FOR INCREMENTAL DESIGN IN PROGRAMMABLE LOGIC DEVICES USING FLOORPLANNING

(75) Inventors: Rajat Aggarwal, Sunnyvale, CA (US); Guenter Stenz, Campbell, CA (US); Srinivasan Dasasathyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 358 days.

(21) Appl. No.: 10/812,550

(22) Filed: Mar. 29, 2004

(51) Int. Cl.
*G06F 17/50* (2006.01)
(52) U.S. Cl. ............................. 716/8; 716/16; 716/17
(58) Field of Classification Search ............. 716/7–12, 716/16–18
See application file for complete search history.

(56) References Cited

U.S. PATENT DOCUMENTS

| | | | | |
|---|---|---|---|---|
| 5,309,371 A | * | 5/1994 | Shikata et al. ................ | 716/10 |
| 5,483,461 A | * | 1/1996 | Lee et al. ..................... | 716/14 |
| 5,818,729 A | * | 10/1998 | Wang et al. .................... | 716/9 |
| 6,002,857 A | * | 12/1999 | Ramachandran ............. | 716/14 |
| 6,086,631 A | * | 7/2000 | Chaudhary et al. .......... | 716/16 |
| 6,134,702 A | * | 10/2000 | Scepanovic et al. ......... | 716/10 |
| 6,301,693 B1 | * | 10/2001 | Naylor et al. ................. | 716/10 |
| 6,510,548 B1 | * | 1/2003 | Squires ........................ | 716/16 |
| 6,530,070 B1 | * | 3/2003 | Kruse ........................... | 716/16 |
| 6,766,500 B1 | * | 7/2004 | Donelly et al. ............... | 716/10 |
| 6,817,005 B1 | * | 11/2004 | Mason et al. ................. | 716/16 |
| 6,870,395 B1 | * | 3/2005 | Schadt et al. ................. | 326/41 |
| 6,871,336 B1 | * | 3/2005 | Chan ............................. | 716/9 |
| 6,907,592 B1 | * | 6/2005 | Dante .......................... | 716/12 |
| 7,010,777 B1 | * | 3/2006 | Hutton et al. ................. | 716/19 |
| 2001/0047509 A1 | * | 11/2001 | Mason et al. ................. | 716/18 |
| 2002/0166098 A1 | * | 11/2002 | Chang et al. .................. | 716/1 |
| 2005/0086624 A1 | * | 4/2005 | Andreev et al. .............. | 716/10 |

OTHER PUBLICATIONS

Hiroshi Murata et al.; "VLSI Module Placement Based on Rectangle-Packing by the Sequence-Pair"; IEEE Transactions on Computer-Aided Design of Integrated Circuits and Systems; vol. 15, No. 12; Dec. 1996; Copyright 1996 IEEE; pp. 1518-1524.
S. Kirkpatrick et al.; "Optimization by Simulated Annealing"; Science; vol. 220, No. 4598; May 12, 1983; pp. 671-680.

* cited by examiner

*Primary Examiner*—Paul Dinh
(74) *Attorney, Agent, or Firm*—Pablo Meles; Kim Kanzaki; Kevin Cuenot

(57) ABSTRACT

A method of designing a programmable logic device can include receiving a modification to a programmable logic device that has been floorplanned. Modules of the programmable logic device that have been changed by the modification can be identified. The changed modules can be floorplanned thereby determining a placement solution that does not violate boundaries of unchanged modules. The programmable logic device then can be placed and routed.

20 Claims, 5 Drawing Sheets

100

| 4 | A1 |
| 3 |

| 5 | B1 |
| 3 |

| 5 | C1 |
| 4 |

| 3 | A2 |
| 4 |

| 4 | B2 |
| 4 |

| 4 | C2 |
| 5 |

| 5 | A3 |
| 2 |

| 2 | B3 |
| 8 |

| 3 | C3 |
| 7 |

Module A
(10 components)

Module B
(15 components)

Module C
(20 components)

200

METHOD, SYSTEM, AND APPARATUS FOR INCREMENTAL DESIGN IN PROGRAMMABLE LOGIC DEVICES USING FLOORPLANNING

BACKGROUND

1. Field of the Invention

The invention relates to the field of circuit design and, more particularly, to floorplanning techniques for programmable logic devices.

2. Description of the Related Art

Programmable logic devices (PLD's) have become increasingly complex and heterogeneous. Modern PLD's, such as field programmable gate arrays (FPGA's), can include a variety of different components including, but not limited to, block random access memory (RAM), multipliers, processors, and the like. This increasing complexity makes circuit design more cumbersome.

Frequently, a PLD undergoes an iterative design process intended to improve the quality of the PLD design and to meet specific design criteria. Oftentimes, the changes to the design from one iteration to the next are incremental in nature. That is, modifications to the PLD design tend to be minor improvements as the design process nears completion and the performance of the PLD design approaches the design criteria.

Presently, when making a minor or incremental improvement to a PLD design, there is little or no guarantee that such an action will produce a predictable result. With reference to FPGA designs, for example, a designer is not assured that a minor change to the mapped netlist will produce a predictable placement and routing.

What is needed is a method, system, and apparatus, for attaining predictable results when implementing incremental changes to a PLD design.

SUMMARY OF THE INVENTION

The various embodiments described with respect to the present invention provide a solution for determining predictable placement and routing when making minor modifications to a mapped netlist description of a PLD. In accordance with the inventive arrangements disclosed herein, a placement of a PLD, such as a FPGA, can be stored persistently such that the placement is maintained in a substantially undisturbed state. Any modifications to the mapped netlist can be incorporated by modifying only those regions or modules of the PLD that were affected by the netlist modification. Boundaries of unchanged modules of the PLD can remain intact, thereby maintaining the predictability of placement and routing functions with respect to the PLD.

One embodiment of the present invention can include a method of designing a programmable logic device. The method can include receiving a modification to a programmable logic device that has been floorplanned and identifying modules of the programmable logic device that have been changed by the modification. The changed modules can be floorplanned thereby determining a placement solution that does not violate boundaries of unchanged modules. The programmable logic device then can be placed and routed.

Other embodiments of the present invention can include a machine readable storage for causing a machine to perform the steps described herein as well as a system having means for performing the various steps described herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figures 1, 2:
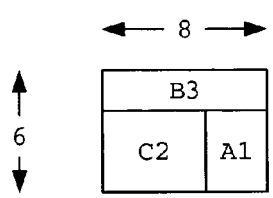
FIG. 1 is a schematic diagram illustrating alternative shapes generated for use during a floorplanning process.
FIG. 2 is a schematic diagram illustrating a proposed solution generated by a floorplanning process.

FIG. 1 is a schematic diagram illustrating sets of alternative shapes 100 generated for use during floorplanning. Floorplanning refers to the process of generating a placement for a PLD design. Floorplanning seeks to generate an overlap-free placement of a set of modules, provided as input to the floorplanning process, subject to optimization criteria such as net length and path delays.

Each module specifies a logical hierarchy or grouping of PLD components that are related to one another and that are to be located or housed within that module. For each module, a set of potential or alternative rectangular shapes, as illustrated in FIG. 1, can be generated. Thus, a set of shapes A1, A2, and A3 has been generated for module A. Shapes B1, B2, and B3 have been generated for module B, and shapes C1, C2, and C3 have been generated for module C. As each module is to include a specific number of components of the PLD, each generated shape must be able to house or accommodate the number of components to be included within the module associated with that shape.

In illustration, module A must accommodate 10 components. Accordingly, each shape associated with module A also must be able to accommodate 10 components. The lengths and widths of each shape shown in FIG. 1 are specified in terms of components. Thus, shape A1 accommodates 12 components, A2 accommodates 12 components, and A3 accommodates 10 components.

Similarly, module B must accommodate 15 components. The shapes B1, B2, and B3 generated for module B accommodate 15, 16, and 16 components respectively. Module C must accommodate 20 components. Shapes C1, C2, and C3, generated for module C, accommodate 20, 20, and 21 components respectively.

The different shapes allow for an optimized design of the PLD with respect to wire length and timing requirements. If too few shapes are generated for each module, the quality of the resulting PLD design can be decreased. Conversely, generating too many shapes can contribute to excessive runtimes. In any case, while any number of shapes can be generated for each module, in one embodiment, 11 shapes can be generated for each module.

FIG. 2 is a schematic diagram illustrating a proposed solution 200 generated by a floorplanning process. The solution has been proposed for a PLD having a width of 8 and a height of 6, thereby allowing the device to accommodate 48 components. As shown, the proposed solution includes shapes A1, B3, and C2 for modules A, B, and C respectively.

To determine a solution, one shape from each set of shapes is selected for each module. The shape is assigned to a location on the PLD such that the shape does not overlap with any other shape assigned to the PLD. The floorplanning process of selecting shapes for modules and assigning shapes to locations on the PLD can be performed using any of a variety of optimization techniques, including, but not limited to simulated annealing as described herein and exhaustive search with branch-and-bound technique.

According to one embodiment, simulated annealing can be used as the optimization technique. Simulated annealing is one variety of stochastic hill-climber algorithms inspired through an analogy with the cooling of metals. Simulated annealing begins with a simulated high temperature and begins randomly generating placement solutions by selecting module shapes, relocating one or more modules, and/or swapping the position of two or more modules. After each swap or iteration, a cost function can be calculated in light of the new placement to evaluate the proposed solution.

If the cost function decreases, indicating that the proposed solution has improved over the last iteration, the solution can be accepted as the current solution and used as a basis for subsequent annealing iterations. If, however, the cost function increases, the solution may or may not be accepted. Specifically, placement solutions producing increasing cost functions can be accepted as the current solution according to a probability that is dependent upon the current value of the temperature.

The probability of accepting a proposed solution showing an increase in a cost function decreases as the temperature decreases during the annealing process. The annealing process incorporates a cooling schedule, or rate of decrease of temperature, such that at high temperatures, almost any proposed placement solution is accepted. Accordingly, at high temperatures, the exploration of different placement solutions is stressed. At lower temperatures, the probability of accepting a solution in which the cost function increases is lessened. Thus, at lower temperatures, the convergence to a particular solution is stressed over exploration of different placement solutions.

FIGS. 3A–3E, taken together, are schematic diagrams illustrating the steps of making incremental design changes to a PLD in accordance with one embodiment of the present invention. An incremental or minor change to a design can be one in which an insubstantial number of components of the affected modules are changed. Typically, each module can accommodate more components than are assigned to that module. As such, each module can accommodate an increase in the number of components, within a given range, assigned to that module. Modules further can accommodate changes to a particular number of components as well as a reduction in the number of components included in that module.

In one embodiment of the present invention, a minor or incremental change can be one that alters less than approximately 10% of the components of one or more modules. Thus, a minor or incremental change can be one that increases or decreases the number of components of one or more modules by approximately 10% or less.

While FIGS. 3A–3D are explained with reference to a single module, it should be appreciated that the various steps described herein can be performed upon one or more modules in serial fashion or upon more than one module substantially simultaneously.

Figure 3A:
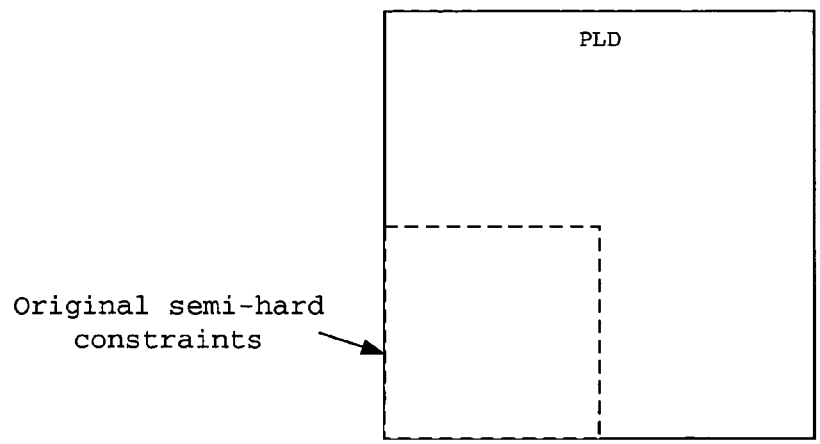
FIGS. 3A–3E, taken together, are schematic diagrams illustrating various stages of incremental PLD design in accordance with one embodiment of the present invention.

FIG. 3A illustrates the case where the boundaries of a modules have been considered to be, or set as, semi-hard constraints. The boundaries, or constraints, are "semi-hard" in that while most of the components are to be located within the shape boundaries, one or more of the components may be placed outside of one of the boundaries in the event that no other feasible solution exists. In other words, one or more of the components of the module can be placed outside of the boundaries of the module in the event that no solution can be determined that complies with predetermined design constraints.

Figure 3B:
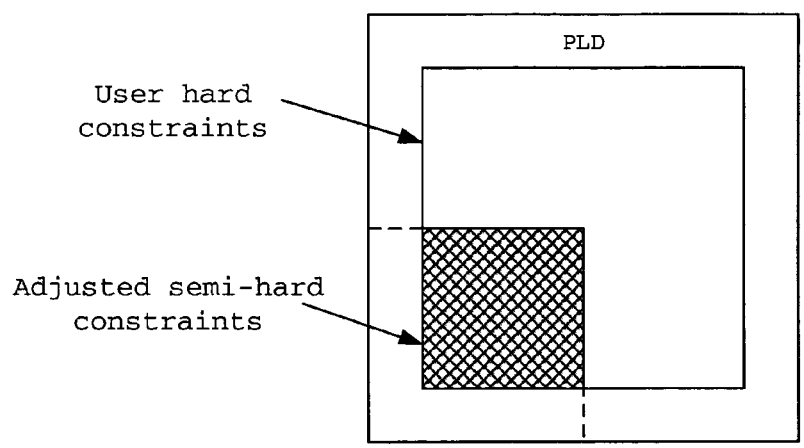

FIG. 3B illustrates the case where hard constraints are determined for the PLD. Hard constraints are design directives or guidelines that cannot be violated. Hard constraints can include, but are not limited to, user-specified constraints, local clock constraints, and global clock constraints.

Figure 3C:
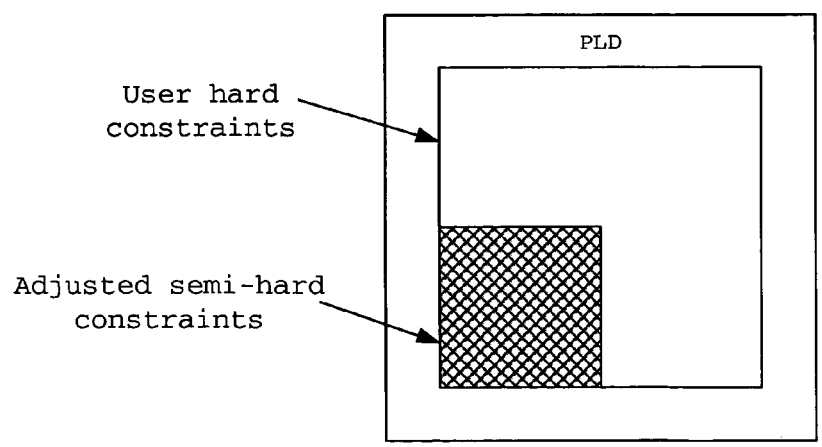

As shown in FIG. 3B, the semi-hard constraints have been adjusted in a manner that is compliant with the hard constraints. In particular, the lower left corner of the semi-hard constraints has been adjusted to conform with the hard constraints. Accordingly, FIG. 3C illustrates the state of the PLD as a result of adjusting the semi-hard constraints prior to application of a fitting technique.

Once both the semi-hard constraints and the hard constraints have been identified, a fitting technique can be initiated to determine at least one feasible solution that complies with the semi-hard and hard constraints. The fitting technique preserves the semi-hard constraints to a large extent such that the hard constraints are met and the components of the module can be accommodated.

Figure 3D:
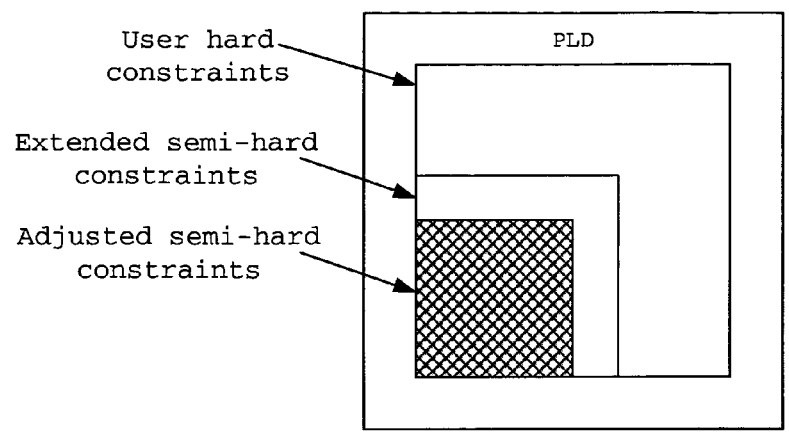

FIG. 3D illustrates the case where the fitting technique cannot determine a feasible solution without violating a semi-hard constraint. Accordingly, the semi-hard constraints, or boundaries, are extended as shown. If a feasible solution can only be determined by violating one or more hard constraints, however, an error condition occurs and the process can be terminated.

Once a feasible solution is determined, the semi-hard constraints are converted to, or reclassified as, hard constraints and stored persistently. That is, module boundaries then can be considered to be hard constraints. In one embodiment of the present invention, each component of the PLD can include one or more parameters indicating each constraint that is applicable to that component.

Figure 3E:
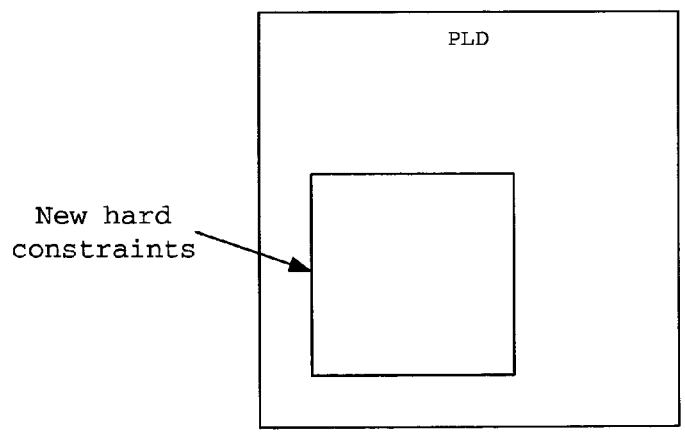

FIG. 3E illustrates the case where the adjusted semi-hard constraints have been converted to hard constraints. Once a feasible solution is determined, the module boundaries, or semi-hard constraints, can be set as hard constraints. Notably, these newly determined hard-constraints are then used during subsequent iterations of the process described herein.

In illustration, if a minor modification to the mapped netlist is made, the changed modules can be identified. Floorplanning can be performed upon any changed modules. Any newly determined and located shapes for the changed modules cannot overlap one another or the unchanged modules. The boundaries of the changed modules are set as semi-hard constraints, while the boundaries of the unchanged modules remain as hard constraints.

The fitting technique can be applied. A feasible solution is determined in observance of the hard and semi-hard constraints as described. The process can be repeated as needed for subsequent minor modifications to the mapped netlist. Through each iteration, only the modules that have been modified are floorplanned as the boundaries of such modules are considered semi-hard constraints. As noted, such a technique provides for predictable placement and routing when minor modifications are implemented as a substantial portion of the placement of the PLD remains unchanged.

Figure 4A:
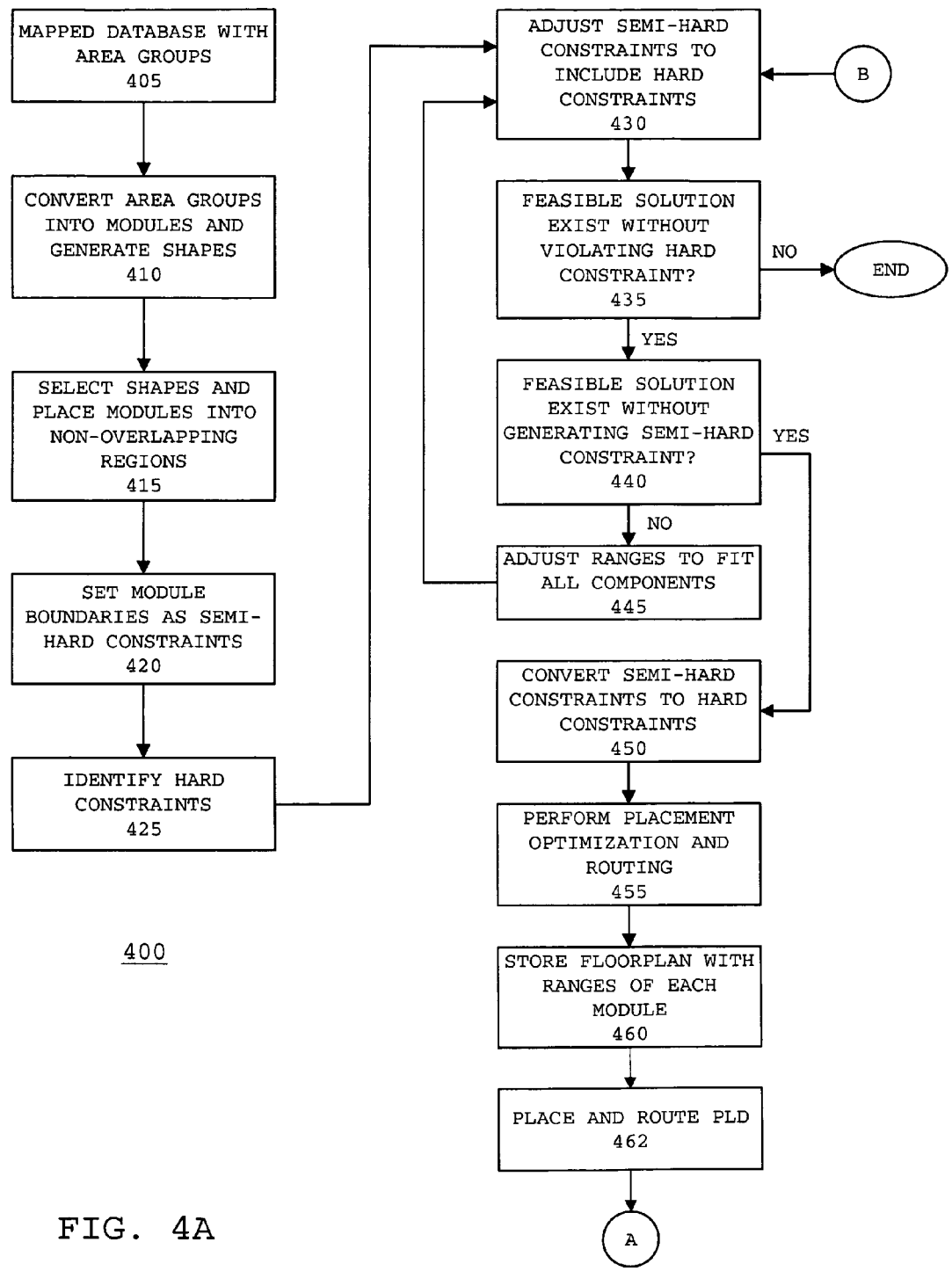
FIGS. 4A and 4B, taken together, are a flow chart illustrating a method of incremental design of a PLD using floorplanning techniques in accordance with another embodiment of the present invention.

FIG. 4 is a flow chart illustrating a method of incremental design of a PLD using floorplanning techniques in accordance with another embodiment of the present invention. The method can begin in step 405 where a mapped netlist is provided as input. In one embodiment, the netlist can be stored and provided from a data structure such as a database. In any case, the mapped netlist can include area-groups specifying related components. An area group is substantially similar to a module, with the exception that the area group is provided from, or specified by, a user, while a module is an internal logical representation of an area group that is used and manipulated by a PLD design system.

In step 410, the area groups are converted into modules and a plurality of shapes are generated for each module. A module is generated for each area-group provided by the user.

In step 415, particular shapes can be selected for each module. The modules also can be placed or assigned to locations on the PLD in a non-overlapping fashion. In step 420, the range of each module can be identified such that the module boundaries are set as the semi-hard constraints.

In step 425, any hard constraints such as user-specified constraints, global clock constraints, and/or local clock constraints can be identified. Accordingly, in step 430, the semi-hard constraints can be adjusted to conform with the hard constraints.

In step 435, a determination is made as to whether a feasible solution can be determined without violating a hard constraint. If so, the method can proceed directly to step 440. If not, an error condition is generated and the process can be terminated. In step 440, a determination can be made as to whether a feasible solution can be determined without violating a semi-hard constraint. If so, the method can proceed to step 450. If not, the method can proceed to step 445 where the boundaries of modules not conforming to the semi-hard constraints are adjusted to fit or include any components associated with that module. The nonconforming modules are adjusted to comply with the semi-hard constraints. After step 445, the method can proceed to step 430.

Continuing with step 450, the semi-hard constraints are classified or set as the hard constraints. In step 455, placement optimization and routing functions can be performed upon the floorplanned PLD design. According to one embodiment, placement optimizations such as component swapping and pin reassignment can be performed to achieve improvements in timing results.

In step 460, the floorplan specifying the boundaries of each module can be stored. In one embodiment, the floorplan can be stored persistently such that any ranges or boundaries for the modules are stored as attributes of the individual components. While any of a variety of storage structures can be used, in one embodiment, a database can be used to store components and component parameters. In step 462, the PLD can be placed and routed.

Figure 4B:
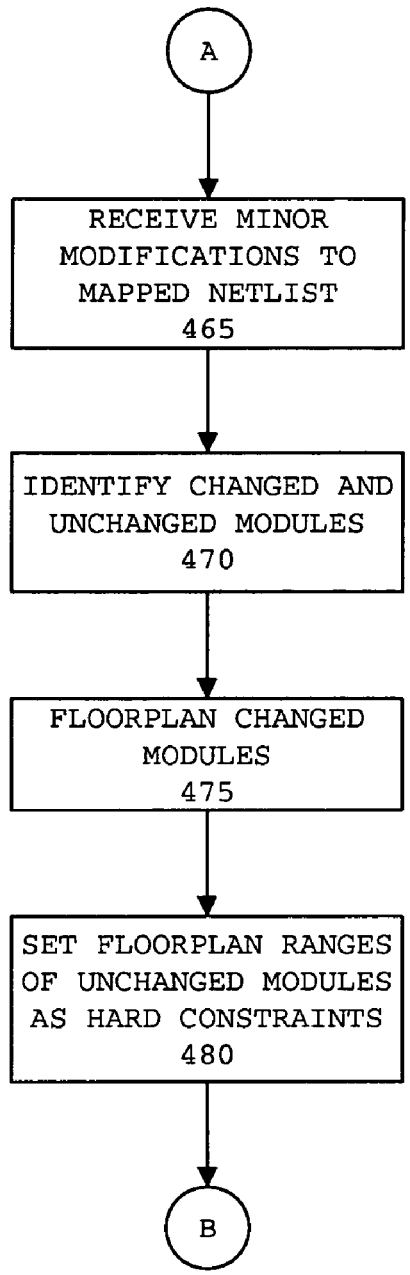

Continuing with FIG. 4B, in step 465, minor modifications to the mapped netlist can be received, for example from a circuit designer. In step 470, changed and unchanged modules can be identified. That is, any modules that were modified as a result of the minor modifications received in step 465 can be identified as well as those modules that were not.

In step 475, the changed modules can be floorplanned. More particularly, shapes can be generated for each changed module. One shape can be selected for each module and placed or assigned a location on the PLD such that the module does not overlap any other module, whether changed or unchanged. As noted, floorplanning can be performed using an optimization technique such as simulated annealing.

In step 480, the ranges or boundaries of changed modules can be set as semi-hard constraints. The method can repeat as necessary where, if need be, the semi-hard constraints are adjusted to conform with the hard constraints to determine a feasible solution. The method can end once a floorplan is determined and stored. It should be appreciated, however, that the method can repeat as needed should additional minor modifications to the mapped netlist be implemented.

The present invention provides a method, system, and apparatus for implementing minor modifications to a mapped netlist using a floorplanning technique. The inventive arrangements disclosed herein provide a solution that allows a circuit designer to make minor modifications to a mapped netlist. The modules that are changed by the modification can be floorplanned and adjusted without violating hard constraints corresponding to unchanged modules. The inventive arrangements disclosed herein facilitate minor modifications while maintaining the predictability of placement and routing functions with respect to the PLD, and more particularly to FPGA, design.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of creating a design for a programmable logic device comprising the steps of:
   receiving a user-specified modification to a programmable logic device design that changes a number of components of at least one module of the programmable logic device design, wherein the programmable logic device design has been floorplanned;
   identifying modules of the programmable logic device design that have been changed by the modification, wherein each changed module comprises a number of components that is different from the number of components within the module prior to the user-specified modification;

floorplanning only the changed modules of the programmable logic device design without altering boundaries of unchanged modules; and placing and routing the programmable logic device design.

2. The method of claim 1, said floorplanning step further comprising:

selecting a shape from a set of shapes for each changed module; and assigning each changed module a non-overlapping location on the programmable logic device according to the selected shape of each module.

3. The method of claim 2, further comprising generating shapes for each changed module.

4. The method of claim 2, said floorplanning step further comprising adjusting a boundary of one of the changed modules to accommodate at least one component of the module without violating a boundary of an unchanged module.

5. The method of claim 1, wherein the programmable logic device is a field programmable gate array.

6. A method of creating a design for a programmable logic device comprising the steps of:

receiving a user-specified modification to a programmable logic device design that changes a number of components of at least one module of the programmable logic device design, wherein the programmable logic device design has been floorplanned, wherein the modification does not alter more than approximately 5 percent of components of the at least one module;

identifying modules of the programmable logic device design that have been changed by the modification, wherein each changed module comprises a number of components that is different from the number of components within the module prior to the user-specified modification;

floorplanning only the changed modules of the programmable logic device design without altering boundaries of unchanged modules; and placing and routing the programmable logic device design.

7. The method of claim 6, wherein the modification does not alter more than approximately 10 percent of components of the at least one module.

8. A system for creating a design for a programmable logic device comprising:

means for receiving a user specified modification to a programmable logic device design that changes a number of components of at least one module of the programmable logic device design, where the programmable logic device design has been floorplanned, wherein the modification does not alter more than approximately 5 percent of components of the at least one module;

means for identifying modules of the programmable logic device design that have been changed by the modification, wherein each changed module comprises a number of components that is different from the number of components within the module prior to the user-specified modification;

means for floorplanning only the changed modules of the programmable logic device design without altering boundaries of unchanged modules; and means for placing and routing the programmable logic device design.

9. The system of claim 8, said means for floorplanning further comprising:

means for selecting a shape from a set of shapes for each changed module; and means for assigning each changed module a non-overlapping location on the programmable logic device according to the selected shape of each module.

10. The system of claim 9, further comprising means for generating the set of shapes for the changed modules.

11. The system of claim 9, said means for floorplanning further comprising means for adjusting a boundary of one of the changed modules to accommodate at least one component of the module without violating a boundary of an unchanged module.

12. The system of claim 8, wherein the programmable logic device is a field programmable gate array.

13. The system of claim 8, wherein the modification does not alter more than approximately 10 percent of components of the at least one module.

14. A machine readable storage, having stored thereon a computer program having a plurality of code sections executable by a machine for causing the machine to perform the steps of:

receiving a user-specified modification to a programmable logic device design that chances a number of components of at least one module of the programmable logic device design, wherein the programmable logic device design has been floorplanned;

identifying modules of the programmable logic device design that have been changed by the modification, wherein each changed module comprises a number of components that is different from the number of components within the module prior to the user-specified modification;

floorplanning only the changed modules of the programmable logic device design without altering boundaries of unchanged modules; and placing and routing the programmable logic device design.

15. The machine readable storage of claim 14, said floorplanning step further comprising:

selecting a shape from a set of shapes for each changed module; and assigning each changed module a non-overlapping location on the programmable logic device according to the selected shape of each module.

16. The machine readable storage of claim 15, further comprising generating shapes for each changed module.

17. The machine readable storage of claim 15, said floorplanning step further comprising adjusting a boundary of one of the changed modules to accommodate at least one component of the module without violating a boundary of an unchanged module.

18. The machine readable storage of claim 14, wherein the programmable logic device is a field programmable gate array.

19. A machine readable storage, having stored thereon a computer program having a plurality of code sections executable by a machine for causing the machine to perform the steps of:

receiving a user-specified modification to a programmable logic device design that chances a number of components of at least one module of the programmable logic device design, wherein the programmable logic device design has been floorplanned, wherein the modification does not alter more than approximately 5 percent of components of the at least one module;

identifying modules of the programmable logic device design that have been changed by the modification, wherein each changed module comprises a number of components that is different from the number of components within the module prior to the user-specified modification;

floorplanning only the changed modules of the programmable logic device design without altering boundaries of unchanged modules; and placing and routing the programmable logic device design.

20. The machine readable storage of claim 19, wherein the modification does not alter more than approximately 10 percent of components of the at least one module.

* * * * *